(12) United States Patent
Byun et al.

(10) Patent No.: US 10,727,444 B2
(45) Date of Patent: Jul. 28, 2020

(54) DISPLAY DEVICE AND METHOD OF MANUFACTURING THE SAME

(71) Applicant: Samsung Display Co., Ltd., Yongin-Si, Gyeonggi-Do (KR)

(72) Inventors: Jinsu Byun, Yongin-si (KR); Koichi Sugitani, Yongin-si (KR); Sumin An, Yongin-si (KR); Gwangmin Cha, Yongin-si (KR); Saehee Han, Yongin-si (KR)

(73) Assignee: Samsung Display Co., Ltd. (KR)

( * ) Notice: Subject to any disclaimer, the term of this patent is extended or adjusted under 35 U.S.C. 154(b) by 0 days.

(21) Appl. No.: 16/407,488

(22) Filed: May 9, 2019

(65) Prior Publication Data

US 2020/0067020 A1  Feb. 27, 2020

(30) Foreign Application Priority Data

Aug. 23, 2018 (KR) .......................... 10-2018-0098762

(51) Int. Cl.
*H01L 27/32* (2006.01)
*H01L 51/52* (2006.01)
*G02B 27/01* (2006.01)

(52) U.S. Cl.
CPC ...... *H01L 51/5256* (2013.01); *G02B 27/0172* (2013.01); *H01L 27/3244* (2013.01);
(Continued)

(58) Field of Classification Search
CPC ............... H01L 27/3244; H01L 27/124; H01L 27/1225; H01L 27/1214; H01L 27/3262; H01L 51/5256; H01L 51/5275; H01L 51/56; H01L 51/52; H01L 51/5253; H01L 2227/323; G02B 27/0172; G02B 27/026; G02B 2027/0178
See application file for complete search history.

(56) References Cited

U.S. PATENT DOCUMENTS 5,952,778 A  *  9/1999  Haskal ................ H01L 51/5256
                                                      313/504
7,579,775 B2     8/2009  Song et al.
(Continued)

FOREIGN PATENT DOCUMENTS

JP      2011-044378 A      3/2011
KR   10-2006-0066003 A     6/2006
(Continued)

*Primary Examiner* — Nikolay K Yushin
(74) *Attorney, Agent, or Firm* — Innovation Counsel LLP

(57) ABSTRACT

A display device includes a display substrate, a light-emitting device, an encapsulation layer over the display substrate and encapsulating the light-emitting device, a filling layer on the encapsulation layer, a first cover layer on the filling layer, an opposite substrate on the first cover layer, and a diffraction grating layer disposed between the first cover layer and the opposite substrate, wherein the diffraction grating layer includes a plurality of diffraction patterns spaced apart from each other by a certain distance, and the plurality of diffraction patterns protrude from the surface of the opposite substrate in a direction perpendicular to the opposite substrate, and the surface of the opposite substrate faces the display substrate.

20 Claims, 8 Drawing Sheets

(52) U.S. Cl.
CPC .. *H01L 51/5275* (2013.01); *G02B 2027/0178* (2013.01); *H01L 2227/323* (2013.01)

(56) References Cited

U.S. PATENT DOCUMENTS

| | | | |
|---|---|---|---|
| 7,589,461 B2* | 9/2009 | Park | H01L 51/5275 313/110 |
| 7,957,621 B2* | 6/2011 | Zhang | B82Y 20/00 257/E33.074 |
| 9,236,420 B2 | 1/2016 | Lee et al. | |
| 9,356,256 B2* | 5/2016 | Choi | H01L 51/0097 |
| 2005/0116625 A1* | 6/2005 | Park | H01L 51/5275 313/504 |
| 2005/0127831 A1* | 6/2005 | Takeuchi | H01L 51/5265 313/506 |
| 2015/0034935 A1* | 2/2015 | Choi | H01L 51/0097 257/40 |
| 2017/0155093 A1 | 6/2017 | Jo | |
| 2018/0314067 A1 | 11/2018 | Cho et al. | |
| 2018/0350883 A1 | 12/2018 | Lee et al. | |

FOREIGN PATENT DOCUMENTS

| | | |
|---|---|---|
| KR | 10-2015-0011908 A | 2/2015 |
| KR | 10-1747268 A | 6/2017 |
| KR | 10-2018-0121750 A | 11/2018 |
| KR | 10-2018-0133024 A | 12/2018 |

* cited by examiner

DISPLAY DEVICE AND METHOD OF MANUFACTURING THE SAME

CROSS-REFERENCE TO RELATED APPLICATION

This application claims the benefit of Korean Patent Application No. 10-2018-0098762, filed on Aug. 23, 2018, in the Korean Intellectual Property Office, the disclosure of which is incorporated herein in its entirety by reference.

BACKGROUND

1. Field

One or more embodiments relate to a display device that may be used in a head-mounted display device and a method of manufacturing the display device.

2. Description of the Related Art

In accordance with rapid advancements in the field of displays capable of visually displaying a variety of electrical signal information, various display devices having excellent characteristics such as a slim profile, a light weight, and low power consumption are being researched and developed. In addition, recently, due to the increasing interest in wearable devices, head-mounted display devices are being introduced. A head-mounted display device may be worn on a user's head or eyes to display an image in front of the user's eyes so that the user may experience virtual reality or augmented reality. The head-mounted display device may include a lens for expanding an image displayed on a location between the display device and the user's eyes by the display device, to thereby provide the image in front of the user's eyes. However, when an image is expanded by the lens, a screen door effect (SDE) may occur in which a non-light-emitting area of the display device is recognized by the user.

SUMMARY

One or more embodiments include a display device configured to, when a head-mounted display device is implemented, provide a high-quality image by resolving a screen door effect, and a method of manufacturing the display device.

Additional aspects will be set forth in part in the description which follows and, in part, will be apparent from the description, or may be learned by practice of the presented embodiments.

According to one or more embodiments, a display device includes: a display substrate; a light-emitting device on the display substrate; an encapsulation layer arranged over the display substrate and encapsulating the light-emitting device; a filling layer on the encapsulation layer; a first cover layer on the filling layer; an opposite substrate on the first cover layer; and a diffraction grating layer between the first cover layer and the opposite substrate, wherein the diffraction grating layer includes a plurality of isolated diffraction patterns spaced apart from each other by a certain distance, and the plurality of diffraction patterns protrude from the surface of the opposite substrate in a direction perpendicular to the opposite substrate, and the surface of the opposite substrate faces the display substrate.

The display device may further include a second cover layer between the encapsulation layer and the filling layer.

A thickness of the second cover layer may be greater than a thickness of the first cover layer.

The first cover layer may include a same material as that of the second cover layer.

The plurality of diffraction patterns may be arranged with a same period in a first direction and a second direction which intersect each other perpendicularly.

The encapsulation layer may include a first inorganic encapsulation layer, an organic encapsulation layer, and a second inorganic encapsulation layer which are sequentially stacked.

Light generated from the light-emitting device may pass through the diffraction grating layer such that a light-emitting area is expanded.

The display substrate may include a base substrate and a thin-film transistor, the thin-film transistor being arranged over the base substrate and electrically connected to the light-emitting device, and the light-emitting device may be an organic light-emitting diode having a pixel electrode electrically connected to the thin-film transistor, an opposite electrode over the pixel electrode, and an intermediate layer between the pixel electrode and the opposite electrode and including an emission layer.

The base substrate and the opposite substrate may each include polyimide.

The plurality of diffraction patterns may diffract light generated from the light-emitting device to generate a reference light emission pattern and a plurality of duplicate light emission patterns.

According to one or more embodiments, a method of manufacturing a display device includes: forming a light-emitting device on a display substrate; forming an encapsulation layer on the display substrate to encapsulate the light-emitting device; forming a diffraction grating layer on a surface of an opposite substrate; forming a first cover layer on the diffraction grating layer; and arranging the opposite substrate such that the diffraction grating layer faces the display substrate, and then, attaching the opposite substrate to the display substrate by using a filling layer, wherein the diffraction grating layer protrudes from the surface of the opposite substrate in a direction perpendicular to the opposite substrate and includes a plurality of isolated diffraction patterns spaced apart from each other, and the first cover layer is formed on the plurality of diffraction patterns and on the surface of the opposite substrate between the plurality of diffraction patterns.

The plurality of diffraction patterns may be arranged with a same period in a first direction and a second direction which intersect each other perpendicularly.

The method may further include, before attaching the opposite substrate to the display substrate, forming a second cover layer on the encapsulation layer.

A thickness of the second cover layer may be greater than a thickness of the first cover layer.

The first cover layer may include a same material as that of the second cover layer.

The display substrate may include a base substrate and a thin-film transistor, the thin-film transistor being arranged over the base substrate and electrically connected to the light-emitting device, and the base substrate may be formed on a first carrier substrate, and after the opposite substrate is attached to the display substrate, the first carrier substrate may be separated from the base substrate.

The light-emitting device may be an organic light-emitting diode having a pixel electrode electrically connected to the thin-film transistor, an opposite electrode over the pixel electrode, and an intermediate layer between the pixel electrode and the opposite electrode and including an emission layer.

The opposite substrate may be formed on a second carrier substrate, and after the opposite substrate is attached to the display substrate, the second carrier substrate may be separated from the opposite substrate.

The base substrate and the opposite substrate may each include polyimide.

The encapsulation layer may be formed by sequentially stacking a first inorganic encapsulation layer, an organic encapsulation layer, and a second inorganic encapsulation layer.

BRIEF DESCRIPTION OF THE DRAWINGS

These and/or other aspects will become apparent and more readily appreciated from the following description of the embodiments, taken in conjunction with the accompanying drawings in which.

DETAILED DESCRIPTION

Figure 1:
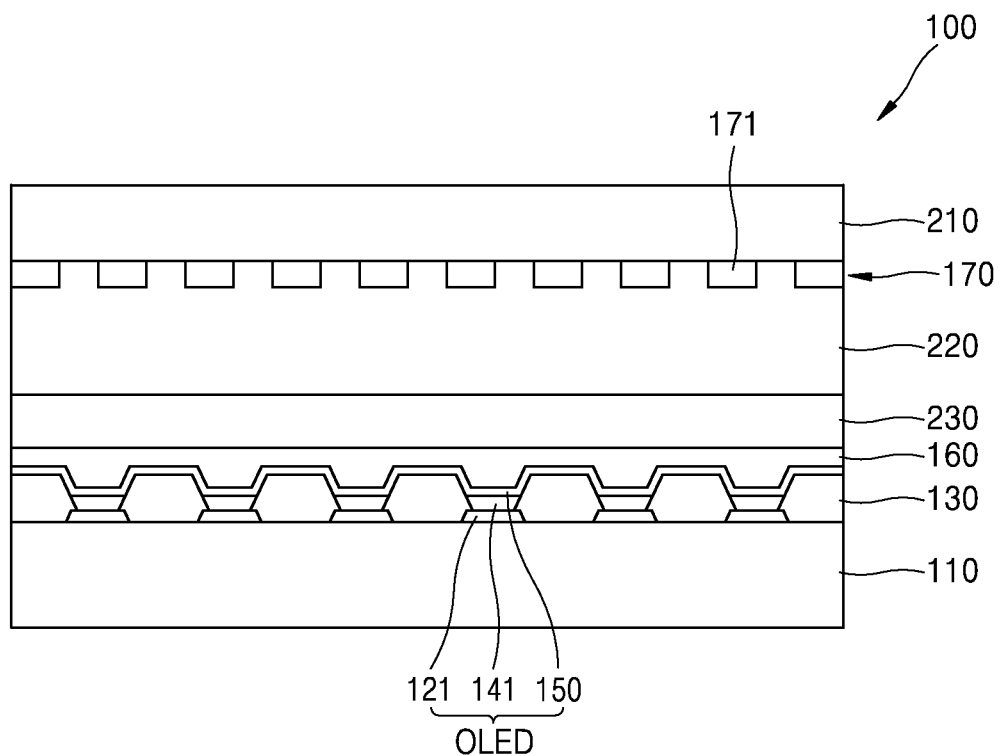
FIG. 1 is a schematic cross-sectional view illustrating an example of a display device according to an embodiment.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description. As used herein, the term "and/or" includes any and all combinations of one or more of the associated listed items. Expressions such as "at least one of," when preceding a list of elements, modify the entire list of elements and do not modify the individual elements of the list.

As the present disclosure allows for various changes and numerous embodiments, particular embodiments will be illustrated in the drawings and described in detail in the written description. Effects and features of the present disclosure and a method of achieving the same will become apparent to those skilled in the art from the following detailed description which discloses various embodiments of the present disclosure in conjunction with the annexed drawings. The present disclosure may, however, be embodied in many different forms and should not be construed as being limited to the embodiments set forth herein.

It will be understood that although the terms "first", "second", etc. may be used herein to describe various components, these components should not be limited by these terms. These components are only used to distinguish one component from another.

As used herein, the singular forms "a", "an" and "the are intended to include the plural forms as well, unless the context clearly indicates otherwise.

It will be further understood that the terms "comprises" and/or "comprising" used herein specify the presence of stated features or components, but do not preclude the presence or addition of one or more other features or components.

It will be understood that when a layer, region, or component is referred to as being "formed on," another layer, region, or component, it can be directly or indirectly formed on the other layer, region, or component. That is, for example, intervening layers, regions, or components may be present.

Sizes of elements in the drawings may be exaggerated for convenience of explanation. In other words, since sizes and thicknesses of components in the drawings are arbitrarily illustrated for convenience of explanation, the following embodiments are not limited thereto.

When a certain embodiment may be implemented differently, a specific process order may be performed differently from the described order. For example, two consecutively described processes may be performed substantially at the same time or performed in an order opposite to the described order.

Hereinafter, embodiments will be described in detail with reference to the attached drawings. Like reference numerals in the drawings denote like elements.

Figure 2:
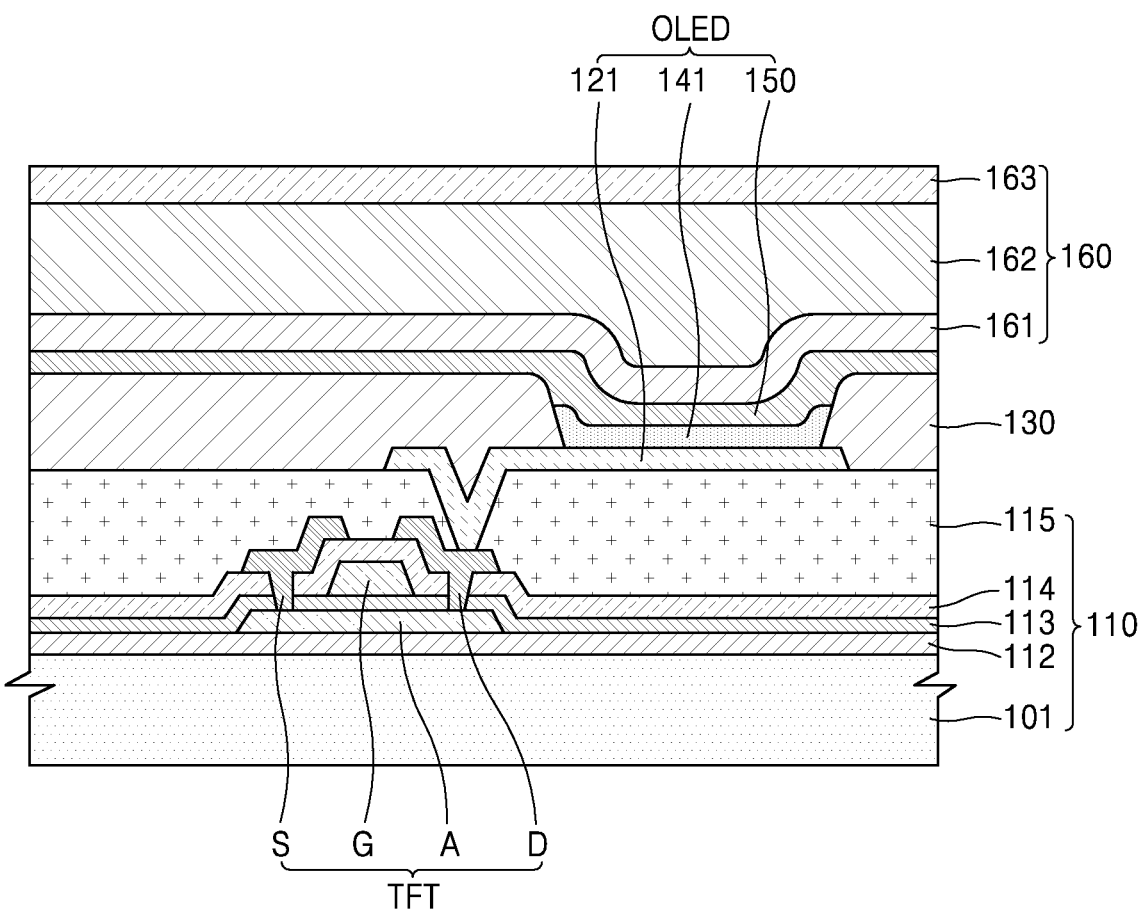
FIG. 2 is a schematic cross-sectional view illustrating an example of a display substrate and a light-emitting device which are included in the display device of FIG. 1.

FIG. 1 is a schematic cross-sectional diagram illustrating an example of a display device 100 according to an embodiment. FIG. 2 is a schematic cross-sectional diagram illustrating an example of a display substrate 110 and a light-emitting device included in the display device 100 of FIG. 1.

Referring to FIGS. 1 and 2, according to an embodiment, the display device 100 may include the display substrate 110, the light-emitting device arranged on the display substrate 110, an encapsulation layer 160 arranged on the light-emitting device, a filling layer 230 arranged on the encapsulation layer 160, a first cover layer 220 arranged on the filling layer 230, a diffraction grating layer 170 arranged on the first cover layer 220, and an opposite substrate 210 arranged on the diffraction grating layer 170. Hereinafter, the light-emitting device is described as an organic light-emitting diode OLED having a pixel electrode 121, an opposite electrode 150, and an intermediate layer 141 arranged between the pixel electrode 121 and the opposite electrode 150 and including an emission layer. However, the present disclosure is not limited thereto, and the display device 100 may include various types of light-emitting device.

The display substrate 110 may include a base substrate 101 and a thin-film transistor TFT arranged over the base substrate 101 and electrically connected to the organic light-emitting diode OLED. In addition, the display substrate 110 may include a capacitor and electronic devices needed to drive the organic light-emitting diode OLED.

The base substrate 101 may be an insulating substrate. For example, the base substrate 101 may be formed of a transparent glass substrate having silicon dioxide ($SiO_2$) as a main component. However, the base substrate 101 is not limited thereto, and may be formed of a transparent plastic material. The plastic material may be polyethersulphone (PES), polyacrylate (PAR), polyetherimide (PEI), polyethylene napthalate (PEN), polyethylene terephthalate (PET), polyphenylene sulfide (PPS), polyarylate, polyimide, polycarbonate (PC), cellulose triacetate (TAC), cellulose acetate propionate (CAP), or the like.

In addition, when the display device 100 is a top-emission type, since the base substrate 101 does not need to be formed of a transparent material, the base substrate 101 may be formed of metal. When the base substrate 101 is formed of metal, the base substrate 101 may include iron, chrome (Cr), manganese, nickel (Ni), titanium (Ti), molybdenum (Mo), stainless steel (SUS), an Invar alloy, an Inconel alloy, a Kovar alloy, or the like.

A buffer layer 112 may be arranged on the base substrate 101. The buffer layer 112 may provide a flat surface to an upper part of the base substrate 101 and prevent foreign substances, etc. from penetrating through the base substrate 101 into the organic light-emitting diode OLED. For example, the buffer layer 112 may contain an inorganic material such as silicon oxide, silicon nitride, silicon oxynitride, aluminum oxide, aluminum nitride, titanium oxide, titanium nitride, or the like, or an organic material such as polyimide, polyester, acryl, or the like. Alternately, the buffer layer 112 may be formed of a stack formed by stacking a plurality of the materials described above.

The thin-film transistor TFT is arranged on the buffer layer 112. The thin-film transistor TFT includes a semiconductor layer A including amorphous silicon, polycrystalline silicon, or an organic semiconductor material, a gate electrode G, a source electrode S, and a drain electrode D.

The gate electrode G is arranged on the semiconductor layer A. According to a signal applied to the gate electrode G, the source electrode S is electrically connected to the drain electrode D. The gate electrode G may include, for example, one or more materials among aluminum (Al), platinum (Pt), palladium (Pd), silver (Ag), magnesium (Mg), gold (Au), Ni, neodymium (Nd), iridium (Ir), Cr, lithium (Li), calcium (Ca), Mo, Ti, tungsten (W), and copper (Cu). The gate electrode G may have a single-layered or multi-layered structure. To ensure insulation between the semiconductor layer A and the gate electrode G, a gate insulating layer 113 may be formed of an inorganic material such as silicon oxide, silicon nitride, silicon oxynitride, etc. and arranged between the semiconductor layer A and the gate electrode G.

An interlayer insulating layer 114 may be arranged on the gate electrode G. The interlayer insulating layer 114 may be formed of an inorganic material such as silicon oxide, silicon nitride, silicon oxynitride, etc. to have a single-layered or multi-layered structure.

The source electrode S and the drain electrode D are arranged on the interlayer insulating layer 114. The source electrode S and the drain electrode D are respectively electrically connected to the semiconductor layer A via contact holes arranged in the interlayer insulating layer 114 and the gate insulating layer 113. In consideration of conductivity, etc., the source electrode S and the drain electrode D may include, for example, one or more materials among Al, Pt, Pd, Ag, Mg, Au, Ni, Nd, Ir, Cr, Li, Ca, Mo, Ti, W, and Cu. The source electrode S and the drain electrode D may have a single-layered or multi-layered structure.

To protect the thin-film transistor TFT, etc. having such a structure, a passivation layer (not shown) may be arranged to cover the thin-film transistor TFT. The passivation layer may be formed of, for example, an inorganic material such as silicon oxide, silicon nitride, silicon oxynitride, etc. The passivation layer may include a single layer or multiple layers.

A planarization layer 115 may be arranged on the thin-film transistor TFT. For example, as illustrated in FIG. 2, when the organic light-emitting diode OLED is arranged in a position above the thin-film transistor TFT, the planarization layer 115 may cover the thin-film transistor TFT to planarize an uneven surface caused by the thin-film transistor TFT. The planarization layer 115 may include an organic material such as acryl, benzocyclobutene (BCB), hexamethyldisiloxane (HMDSO), or the like. FIG. 2 shows that the planarization layer 115 has a single layer. However, the planarization layer may have multiple layers or be various modified. In the current embodiment, the display device 100 may have both the passivation layer and the planarization layer 115, or may have only the planarization layer 115 as needed.

The organic light-emitting diode OLED is arranged on the display substrate 110 to have the pixel electrode 121, the opposite electrode 150, and the intermediate layer 141 arranged between the pixel electrode 121 and the opposite electrode 150. In detail, a contact hole is arranged in the planarization layer 115 to expose at least one of the source electrode S and the drain electrode D of the thin-film transistor TFT. The pixel electrode 121 is arranged on the planarization layer 115 and contacts one of the source electrode S and the drain electrode D via the contact hole to thereby be electrically connected to the thin-film transistor TFT.

The pixel electrode 121 may be a (semi)transparent electrode or a reflective electrode. When the pixel electrode 121 is a (semi)transparent electrode, the pixel electrode 121 may include indium tin oxide (ITO), indium zinc oxide (IZO), zinc oxide (ZnO), indium oxide ($In_2O_3$), indium gallium oxide (IGO), or aluminum zinc oxide (AZO). When the pixel electrode 121 is a reflective electrode, the pixel electrode 121 may include a reflective layer formed of Ag, Mg, Al, Pt, Pd, Au, Ni, Nd, Ir, Cr, or a compound thereof or a layer formed of ITO, IZO, ZnO, $In_2O_3$, IGO, or AZO. However, the present disclosure is not limited thereto. The pixel electrode 121 may be various modified to include various materials, have a single-layered or multi-layered structure, or the like.

A pixel-defining layer 130 may be arranged on the planarization layer 115. The pixel-defining layer 130 has an opening exposing at least a center of the pixel electrode 121 to thereby define a pixel. In addition, in the case shown in FIG. 2, the pixel-defining layer 130 covers an edge of the pixel electrode 121 to increase a distance between the edge of the pixel electrode 121 and the opposite electrode 150 arranged over the pixel electrode 121, thereby preventing generation of an arc, etc. at the edge of the pixel electrode 121. The pixel-defining layer 130 may include an organic material, for example, polyimide, Hexamethyldisiloxane (HMDSO), or the like.

The intermediate layer 141 of the organic light-emitting diode OLED includes the emission layer. The emission layer may include a polymer or low-molecular weight organic material emitting light having a certain color. In addition, the intermediate layer 141 may include at least one functional layer among a hole transport layer (HTL), a hole injection layer (HIL), an electron transport layer (ETL), and an electron injection layer (EIL). The functional layer may include an organic material.

The opposite electrode 150 may be formed as one body to cover a plurality of the organic light-emitting diodes OLED to correspond to a plurality of pixel electrodes 121. The opposite electrode 150 may be a (semi)transparent electrode or a reflective electrode. When the opposite electrode 150 is a (semi)transparent electrode, the opposite electrode 150 may include a layer formed of metal having a low work function, that is, Li, Ca, lithium-fluoride-calcium (LiF/Ca), lithium-fluoride-aluminum (LiF/Al), Al, Ag, Mg, or a compound thereof or a (semi)transparent conductive layer formed of ITO, IZO, ZnO or $In_2O_3$. When the opposite electrode 150 is a reflective electrode, the opposite electrode 150 may have a layer formed of Li, Ca, LiF/Ca, LiF/Al, Al, Ag, Mg or a compound thereof. However, a composition and a material of the opposite electrode 150 is not limited thereto, and variously modified.

The encapsulation layer 160 is arranged on the opposite electrode 150, The encapsulation layer 160 protects the organic light-emitting diode OLED from external moisture, oxygen, or the like. As an example, the encapsulation layer 160 may include a first inorganic encapsulation layer 161, an organic encapsulation layer 162, and a second inorganic encapsulation layer 163.

The first inorganic encapsulation layer 161 covers the opposite electrode 150 and may include silicon oxide, silicon nitride, and/or silicon oxynitride. Since the first inorganic encapsulation layer 161 is arranged along a structure arranged therebelow, an upper surface thereof may not be flat as illustrated in FIG. 2. Since the organic encapsulation layer 162 covers the first inorganic encapsulation layer 161 and have a sufficient thickness, an upper surface of the organic encapsulation layer 162 may be substantially flat. The organic encapsulation layer 162 may include one or more materials selected from a group consisting of polyethylene terephthalate, polyethylene naphthalate, polycarbonate, polyimide, polyethylene sulfonate, polyoxymethylene, polyarylate, and hexamethyldisiloxane. The second inorganic encapsulation layer 163 covers the organic encapsulation layer 162 and may include silicon oxide, silicon nitride, and/or silicon oxynitride. The second inorganic encapsulation layer 163 may extend toward outside of the organic encapsulation layer 162 to contact the first inorganic encapsulation layer 161 so that the organic encapsulation layer 162 is not exposed to outside.

As such, since the encapsulation layer 160 includes the first inorganic encapsulation layer 161, the organic encapsulation layer 162, and the second inorganic encapsulation layer 163, even when cracks occur in the encapsulation layer 160 due to such a multi-layered structure, the cracks may not be connected to each other between the first inorganic encapsulation layer 161 and the organic encapsulation layer 162 or between the organic encapsulation layer 162 and the second inorganic encapsulation layer 163. Thus, forming of a path via which external moisture, oxygen, etc. penetrates into the display device 100 may be prevented or minimized.

A capping layer may be further arranged between the opposite electrode 150 and the encapsulation layer 160 to enhance light coupling efficiency of light generated from the organic light-emitting diode OLED. As an embodiment, the capping layer may be formed of an organic or inorganic layer.

The filling layer 230 is arranged on the encapsulation layer 160. The filling layer 230 may attach the display substrate 110 including the organic light-emitting diode OLED to the opposite substrate 210 on which the diffraction grating layer 170, etc. is disposed. In detail, the filling layer 230 may be arranged between the encapsulation layer 160 and the first cover layer 220 to attach the encapsulation layer 160 to the first cover layer 220. The filling layer 230 may be formed of a silicon-based additive, an acrylic-based additive, or the like and further include a hardening agent, a crosslinking agent, an ultraviolet stabilizer, etc. The filling layer 230 may be a pressure-sensitive adhesive (PSA), an optically clear additive (OCA), or the like. The filling layer 230 may have a thickness of about 10 μm or less.

The first cover layer 220 separates the organic light-emitting diode OLED from the diffraction grating layer 170 by a certain distance. As described hereinafter, an area in which a duplicate light emission pattern generated by the diffraction grating layer 170 is determined by a distance of diffraction of light generated by the organic light-emitting diode OLED. The distance of diffraction is affected by a distance between the organic light-emitting diode OLED and the diffraction grating layer 170. That is, when the distance between the organic light-emitting diode OLED and the diffraction grating layer 170 is too small, for example, when the thickness of the first cover layer 220 is too small, since an area in which the duplicate light emission pattern is formed becomes small, it may be difficult to resolve a screen door effect (SDE) when a head-mounted display device is implemented. On the other hand, when the space between the organic light-emitting diode OLED and the diffraction grating layer 170 is too large, since the distance of diffraction is excessively increased, blurring in which a color is mixed with light generated by the organic light-emitting diode OLED may occur. As an example, when the display device 100 has a resolution of 571 ppi, the first cover layer 220 may have a thickness of about 300 μm. However, the present disclosure is not limited thereto. A thickness of the first cover layer 220 may be appropriately selected to increase the area in which the duplicate light emission pattern is formed and balance the blurring.

The first cover layer 220 may be formed of an inorganic material or an organic material having a high refractive index. When the first cover layer 220 is formed of an inorganic material, the first cover layer 220 may include at least one among $SiO_2$, silicon nitride (SiNx), zinc peroxide ($ZnO_2$) titanium dioxide ($TiO_2$), zirconium dioxide ($ZrO_2$), ITO, and IZO. When the first cover layer 220 is formed of an organic material, the first cover layer 220 may include at least one among acryl, tris-8-hydroxyquinoline aluminum (Alq3), copper phthalocyanine (CuPc), 4,4'-bis(N-carbazolyl)-1,1'-biphenyl (CBP), and N,N'-di(naphthalene-1-yl)-N,N'-diphenyl-benzidine (a-NPB).

The opposite substrate 210 is arranged on the first cover layer 220, and the diffraction grating layer 170 is arranged on a surface of the opposite substrate 210. Here, the diffraction grating layer 170 may be arranged on a surface of the opposite substrate 210 facing the display substrate 110.

The opposite substrate 210 may be formed of polyimide, acrylate, or the like. However, the opposite substrate 210 is not limited thereto. The opposite substrate 210 may be formed of various materials such as PET, PEN, etc. or metal. According to cases, a thin metal foil like stainless steel like SUS may be used for the opposite substrate 210.

The diffraction grating layer 170 includes a plurality of diffraction patterns 171 spaced apart from each other by a certain distance, and are arranged in a path of light emitted from the organic light-emitting diode OLED to diffract the emitted light, thereby expanding a light emitting area of the organic light-emitting diode OLED.

Although not shown in the drawing, an input detector may be further arranged over the encapsulation layer 160. The input detector may be formed directly on the encapsulation layer 160 and include a plurality of detection electrodes to detect a contact with an external touch input element like a user's hand or a pen, etc., to thereby generate an input signal. As such, when the input detector is further arranged over the encapsulation layer 160, the filling layer 230 is arranged between the input detector and the first cover layer 220.

Figure 3:
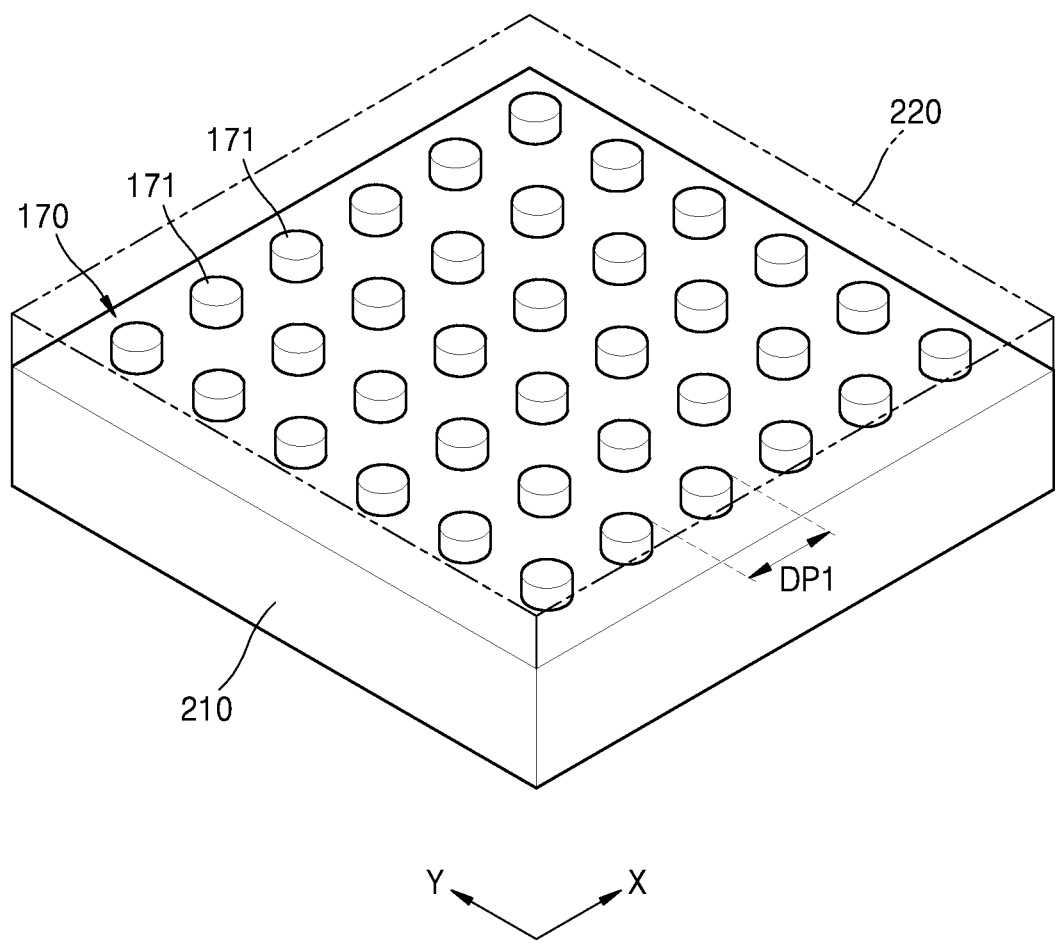
FIG. 3 is a schematic perspective view illustrating an example of a diffraction grating layer of the display device of FIG. 1.
Figure 4:
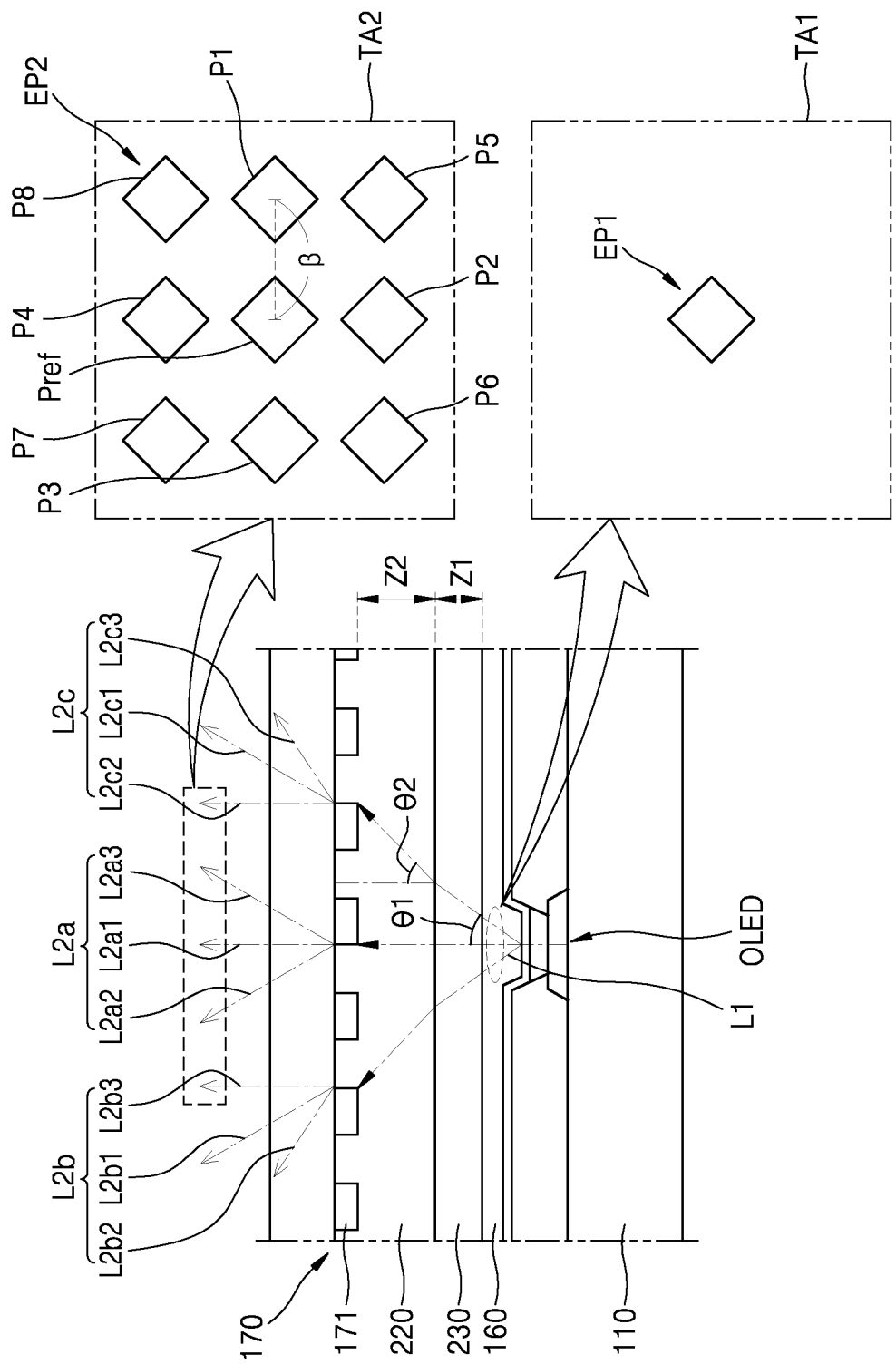
FIG. 4 is a mimetic diagram for explaining expansion of a light-emitting area, the expansion being performed by the diffraction grating layer of the display device of FIG. 1.

FIG. 3 is a schematic perspective view illustrating an example of the diffraction grating layer 170 of the display device 100 of FIG. 1. FIG. 4 is a mimetic diagram for explaining expansion of a light emitting area, the expansion being performed by the diffraction grating layer 170 of the display device of FIG. 1.

The diffraction grating layer 170 is arranged on a surface of the opposite substrate 210. Here, the surface of the opposite substrate 210 on which the diffraction grating layer 170 is arranged may be a surface facing the display substrate 110 of FIG. 1.

Each of the plurality of diffraction patterns 171 may protrude from the surface of the opposite substrate 210 in a direction perpendicular to the opposite substrate 210, and have a same shape. As an example, each of the plurality of diffraction patterns 171 may have a cylindrical shape. However, the plurality of diffraction patterns 171 are not limited thereto, and respectively have various shapes such as a shape of a rectangular column.

The plurality of diffraction patterns 171 may be spaced apart from each other by a certain distance. That is, the plurality of diffraction patterns 171 may be respectively arranged on the surface of the opposite substrate 210 with a same period DP1 in a first direction X and a second direction Y. The first direction X may be perpendicular to the second direction Y. The period DP1 refers to a distance from a side of a diffraction pattern 171 to a corresponding position of the side of a neighboring diffraction pattern 171. Alternately, the period DP1 may be understood as a distance between a center of a diffraction pattern 171 and that of a neighboring diffraction pattern 171 along the first direction X and the second direction Y.

The first cover layer 220 is arranged on the diffraction grating layer 170. Since the diffraction grating layer 170 includes the plurality of diffraction patterns 171 that are spaced apart from each other, the first cover layer 220 is arranged not only on the plurality of diffraction patterns 171 but also on a surface of the opposite substrate 210 arranged between the plurality of diffraction patterns 171. That is, the plurality of diffraction patterns 171 may have shapes that extend into the first cover layer 220.

As illustrated in FIG. 4, the plurality of diffraction patterns 171 may increase a light emitting area of light generated by the organic light-emitting diode OLED.

Hereinafter, a light emission pattern generated in a first area TA1 by light L1 emitted from the organic light-emitting diode OLED is defined as a first light emission pattern EP1. A light emission pattern generated in a second area TA2 by light L2a, L2b, and L2c having passed through the diffraction grating layer 170 is defined as a second light emission pattern EP2. The first area TA1 may be an arbitrary area arranged below the filling layer 230. The second area TA2 may be an area arranged over the diffraction grating layer 170. In addition, the light L1 emitted from the organic light-emitting diode OLED is referred to as 'emitted light', and the light L2a, L2b, and L2c having passed through the diffraction grating layer 170 is referred to as 'diffracted light'.

The emitted light L1 may pass through the filling layer 230 and the first cover layer 220 arranged over the encapsulation layer 160, and then, be provided to the diffraction grating layer 170. According to refractive indices of the filling layer 230 and the first cover layer 220, the emitted light L1 may be incident on the filling layer 230 at a first incident angle θ1 and on the first cover layer 220 at a second incident angle θ2.

The diffraction grating layer 170 may generate the diffracted light L2a, L2b, and L2c by diffracting the emitted light L1. Hereinafter, for convenience of description, a description is provided with respect to first to third diffracted lights L2a, L2b, and L2c.

The first to third diffracted lights L2a, L2b, and L2c may respectively include $0^{th}$ order diffracted light and $1^{st}$ order diffracted light. Here, the $0^{th}$ order diffracted light refers to light having a same optical path before and after the light is diffracted by the diffraction grating layer 170. In addition, the $1^{st}$ diffracted light refers to light having an optical path changed by the diffraction grating layer 170 and having a second diffracted angle with reference to the $0^{th}$ diffracted light.

That is, reference numerals L2b1, L2a1, and L2c1 denote the $0^{th}$ diffracted light. In addition, reference numerals L2b2, L2b3, L2a2, L2a3, L2c2, and L2c3 denote the $1^{st}$ diffracted light. As another embodiment, the $1^{st}$ to $3^{rd}$ diffracted lights L2a, L2b, and L2c may further include $2^{nd}$ or higher diffracted light. However, in this specification, for convenience of description, it is described as an example that the first to third diffracted lights L2a, L2b, and L2c include the $0^{th}$ diffracted light and the $1^{st}$ diffracted light.

The first to third diffraction light L2a, L2b, and L2c may include first to third effective light L2a1, L2b3, and L2c2 respectively having an optical path in a direction perpendicular to the display substrate 110. Here, the perpendicular direction may include not only a direction completely perpendicular to the display substrate 110 but also a direction substantially near perpendicular to the display substrate 110. When an optical path of effective light is in a direction perpendicular to the display substrate 110, a number of orders of diffracted light is not limited. That is, when an optical path of the effective light is in the perpendicular direction, the effective light may include both $0^{th}$ diffracted light and $1^{st}$ diffracted light.

The diffraction grating layer 170 may generate the first to third effective light L2a1, L2b3, and L2c2 by diffracting the light L1 emitted from the organic light-emitting diode OLED. Accordingly, the second light emission pattern EP2 may include a reference light emission pattern Pref and a plurality of duplicate light emission patterns P1 to P8 duplicated from the reference light emission pattern Pref.

The first area TA1 may have a same size as that of the second area TA2. On the other hand, a number of light emission patterns included in the second area TA2 is greater than that of light emission patterns included in the first area TA1. This indicates that a light emission area of the second area TA2 is larger than that of the first area TA1. A larger light emission area may be expressed as a larger effective light emission area ratio. An effective light emission area ratio is defined as a ratio of the size of a light emission pattern area present in an area to the size of the area. Here, a light emission pattern for calculating the effective light emission area ratio may include both a reference light emission pattern and a duplicate light emission pattern. As an example, whereas 9 light emission patterns including the reference light emission pattern Pref and the plurality of duplicate light patterns P1 to P8 are present in the second area TA2, one light emission pattern is present in the first area TA1. Accordingly, an effective light emission area ratio for the second area TA2 is greater than that for the first area TA1.

The effective light emission area ratio generally increases when a diffraction distance β increases. The diffraction distance β may be affected by a wavelength of light emitted by the organic light-emitting diode OLED, a thickness and a refractive index of the filling layer 230, a thickness and a refractive index of the first cover layer 220, the period DP1 of the diffraction patterns 171, etc. A path of light emitted by the organic light-emitting diode OLED may also be affected by the encapsulation layer 160. However, this is insignificant compared to an effect of the first cover layer 220, etc. Accordingly, the diffraction distance β may be expressed as Equation 1 below.

$$\beta = z1 \cdot \tan \theta 1 + z2 \cdot \tan \theta 2 \quad \text{[Equation 1]}$$

where z1 represents a thickness of the filling layer 230. z2 represents a shortest distance between the filling layer 230 and the plurality of diffraction patterns 171. As described above, θ1 and θ2 respectively represent incident angles with respect to the filling layer 230 and the first cover layer 220 and may be respectively expressed as Equations 2 and 3 below.

$$\theta 1 = \sin^{-1}\left(\frac{\lambda}{DP1} \cdot \frac{1}{n230}\right) \quad \text{[Equation 2]}$$

where λ represents a wavelength of light emitted by the organic light-emitting diode OLED. n230 represents a refractive index of the filling layer 230.

$$\theta 2 = \sin^{-1}\left(\frac{\lambda}{DP1} \cdot \frac{1}{n220}\right) \quad \text{[Equation 3]}$$

where n220 represents a refractive index of the first cover layer 220.

When θ1 are θ2 are substituted in Equation 1, the diffraction distance β may be expressed as Equation 4.

$$\beta = \quad \text{[Equation 4]}$$
$$z1 \cdot \tan\left[\sin^{-1}\left(\frac{\lambda}{DP1} \cdot \frac{1}{n230}\right)\right] + z2 \cdot \tan\left[\sin^{-1}\left(\frac{\lambda}{DP1} \cdot \frac{1}{n220}\right)\right]$$

As a selective embodiment, when a refractive index of another element arranged between the filling layer 230 and the organic light-emitting diode OLED, for example, the encapsulation layer 160 is to be taken into account, the diffraction distance β may be changed according to a refractive index and a thickness of the other element.

As another example, when a thickness of the filling layer 230 is much smaller than that of the first cover layer 220, Equation 4 shown above may be expressed briefly as Equation 5.

$$\beta' = z2 \cdot \tan\left[\sin^{-1}\left(\frac{\lambda}{DP1} \cdot \frac{1}{nEN}\right)\right] \quad \text{[Equation 5]}$$

That is, according to an embodiment, the display device 100 of FIG. 1 may control the diffraction distance β by adjusting a color of light emitted by the organic light-emitting diode OLED, a thickness and a refractive index of the first cover layer 220, the period DP1 of the diffraction patterns 171, etc. By doing so, an effective light emission area ratio of the display device 100 of FIG. 1 may be optimized. Accordingly, in the present disclosure, when the display device 100 of FIG. 1 is used for the head-mounted display device, even when an image is expanded by a lens, occurrence of an SDE may be prevented.

Figure 5:
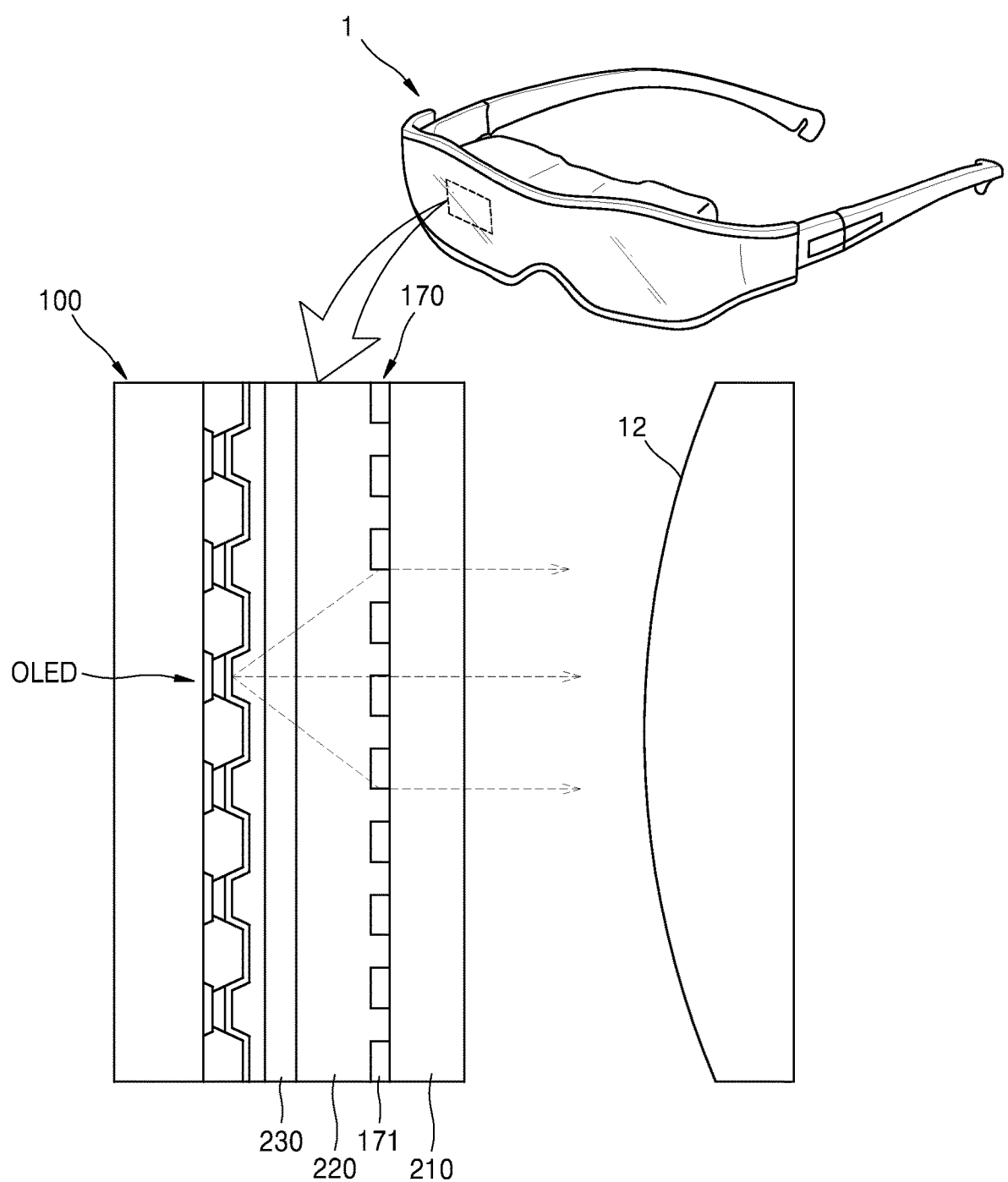
FIG. 5 is a schematic cross-sectional diagram illustrating an example of a head-mounted display device including the display device of FIG. 1.

FIG. 5 is a schematic cross-sectional diagram illustrating an example of a head-mounted display device 1 including the display device 100 of FIG. 1.

Referring to FIG. 5, the head-mounted display device 1 may include a lens 12 and the display device 100 providing an image to the lens 12. In addition, the head-mounted display device 1 may further include a camera, an infrared light sensor, a signal processor, and a frame having such a form that may be worn on a user's head.

The lens 12 may be arranged between the display device 100 and the user to expand an image provided by the display device 100. The lens 12 may include an opaque lens to implement virtual reality or a transparent lens or a semi-transparent lens to implement augmented reality.

As described above, the display device 100 includes the diffraction grating layer 170. Since the diffraction grating layer 170 includes the plurality of diffraction patterns 171 spaced apart from each other by a certain distance, an effective light emission area of light emitted from the organic light-emitting diode OLED, passing through the filling layer 230 and the first cover layer 220, and thus, refracted may be increased. Accordingly, even when the lens 12 expands an image displayed by the display device 100, since the user may not easily recognize a non-light emitting area of the display device 100, when the head-mounted display device 1 is driven, an SDE may be resolved and a high-quality image may be provided.

Figure 6:
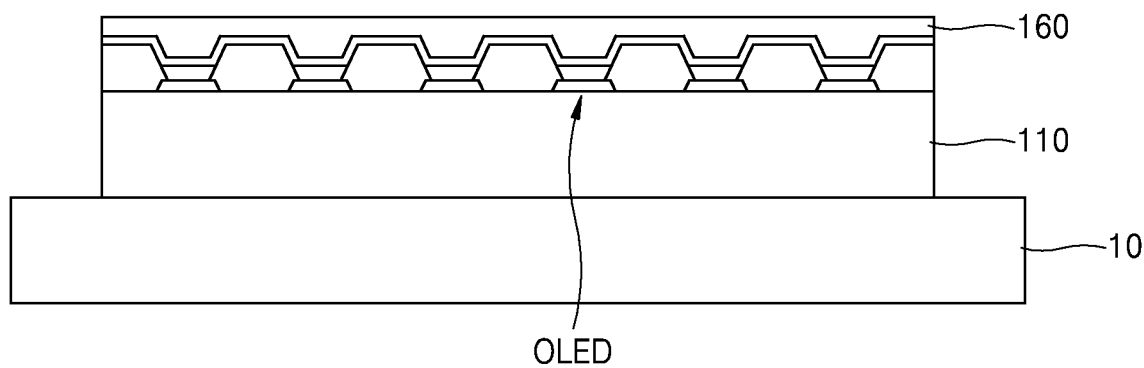
FIGS. 6 and 7 are schematic cross-sectional views illustrating a method of manufacturing the display device of FIG. 1.
Figure 7:
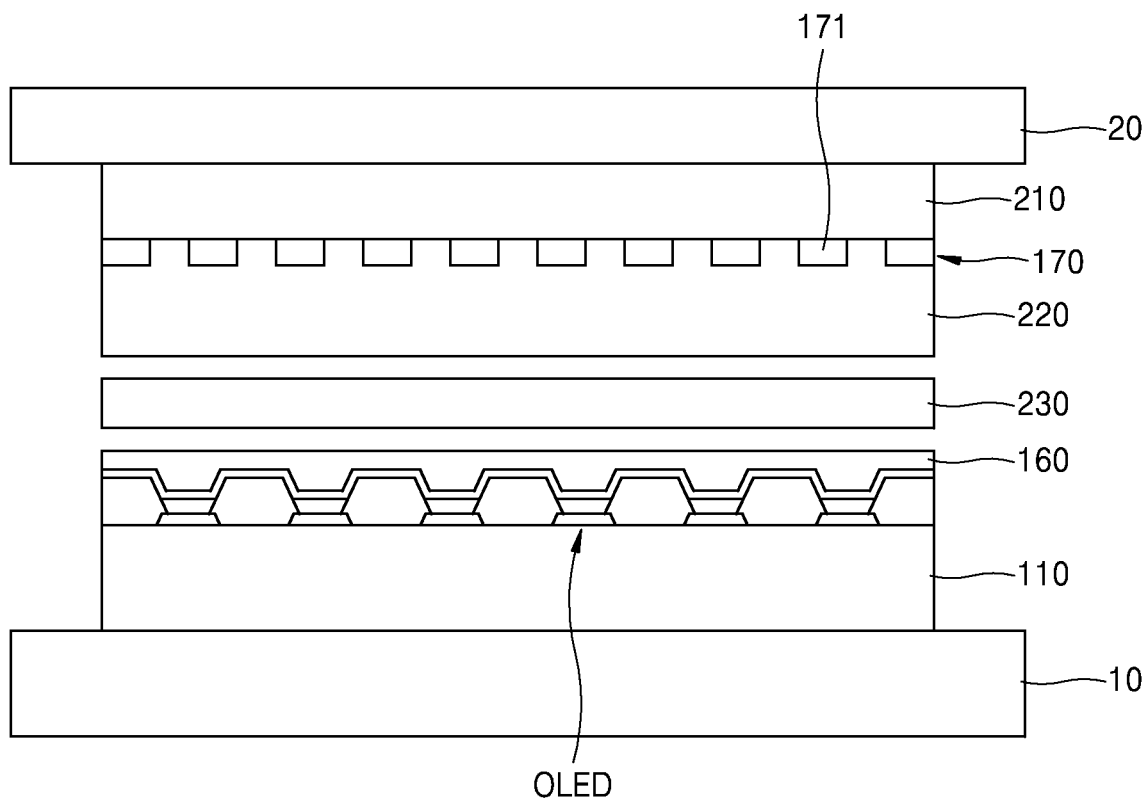

FIGS. 6 and 7 are schematic diagrams illustrating a method of manufacturing the display device 100 of FIG. 1.

According to an embodiment, a method of manufacturing the display device 100 may include forming the organic light-emitting diode OLED and the encapsulation layer 160 on the display substrate 110, forming the diffraction grating layer 170 and the first cover layer 220 on a surface of the opposite substrate 210, and positioning the opposite substrate 210 so that the first cover layer 220 faces the display substrate 110, and then, attaching the display substrate 110 to the opposite substrate 210 by using the filling layer 230.

As illustrated in FIG. 6, the organic light-emitting diode OLED is formed on the display substrate 110, and then, the encapsulation layer 160 is formed on the organic light-emitting diode OLED to seal the organic light-emitting diode OLED. In this case, as described above, the thin-film transistor TFT of FIG. 2 electrically connected to the organic light-emitting diode OLED may be formed on the display substrate 110.

The display substrate 110 may be formed on a first carrier substrate 10 formed of a glass material, etc. As described above, when the display substrate 110 includes the base substrate 101 of FIG. 2 and the base substrate 101 of FIG. 2 is formed of a flexible material, the first carrier substrate 10 may keep the base substrate 101 of FIG. 2 to be flat when the thin-film transistor TFT of FIG. 2, the organic light-emitting diode OLED, etc. are formed on the base substrate 101 of FIG. 2 having a small thickness.

Then, as illustrated in FIG. 7, the diffraction grating layer 170 and the first cover layer 220 are sequentially formed on a surface of the opposite substrate 210. The opposite substrate 210 may be formed on a second carrier substrate 20 formed of a glass material, etc. Accordingly, when the opposite substrate 210 is formed of a material like polyimide, etc., the surface of the opposite substrate 210 may be very flat. In addition, when the diffraction grating layer 170 and the first cover layer 220 are formed on the opposite substrate 210, bending of the opposite substrate 210 may be prevented.

The diffraction grating layer 170 may include at least one among silicon oxide, silicon nitride, and silicon oxynitride. As an example, the diffraction grating layer 170 may be formed by positioning a deposition mask on a surface of the opposite substrate 210, and then, depositing the materials described above. The deposition mask includes a plurality of openings, and the plurality of diffraction patterns 171 of the diffraction grating layer 170 may be formed at positions of the plurality of diffraction patterns 171. As another example, a material of the diffraction grating layer 170 may be deposited on a whole surface of the opposite substrate 210 to form a layer, and then, patterned to thereby form the plurality of diffraction patterns 171.

Then, the first cover layer 220 is formed on the diffraction grating layer 170. The first cover layer 220 may be formed of an organic material or an inorganic material When the first cover layer 220 is formed of an organic material, the first cover layer 220 may include at least one among acryl, Alq3, CuPc, CBP, and a-NPB. The first cover layer 220 may be formed by using a method such as slit coating, etc.

As another example, when the first cover layer 220 is formed of an inorganic material, the first cover layer 220 may include at least one among $SiO_2$, SiNx, $ZnO_2$ $TiO_2$, $ZrO_2$, ITO, and IZO, and be formed by using a deposition process. Particularly, since the first cover layer 220 is formed to be separate from the display substrate 110, even when the first cover layer 220 is formed by using a high temperature deposition method other than a low temperature deposition method, the organic light-emitting diode OLED of the display substrate 110 may be prevented from being damaged due to heat in a process of forming the first cover layer 220. Accordingly, the first cover layer 220 may be formed of a material such as $TiO_2$, $ZrO_2$, etc.

Since the diffraction grating layer 170 includes the plurality of diffraction patterns 171 separate from each other, the first cover layer 220 is arranged not only on the plurality of diffraction patterns 171 but also on a surface of the opposite substrate 210 between the plurality of diffraction patterns 171. That is, the plurality of diffraction patterns 171 may have a shape protruded into the first cover layer 220.

Then, after the opposite substrate 210 is arranged so that the first cover layer 220 faces the display substrate 110, the display substrate 110 is attached to the opposite substrate 210, and then, attached to the opposite substrate 210 and the display substrate 110. The filling layer 230 may be sprayed onto a surface of at least one of the encapsulation layer 160 and the first cover layer 220. The filling layer 230 may be a PSA, an OCA, etc., and have a thickness of about 10 μm or less.

After the opposite substrate 210 is attached to the display substrate 110, the first carrier substrate 10 is separated from the display substrate 110, and then, the second carrier substrate 20 is separated from the opposite substrate 210. As an example, the first carrier substrate 10 may be separated from the display substrate 110 by radiating laser between the base substrate 101 of FIG. 2 of the display substrate 110 and the first carrier substrate 10. Likewise, the second carrier substrate 20 may be separated from the opposite substrate 210 by radiating laser between the opposite substrate 210 and the second carrier substrate 20.

Figure 8:
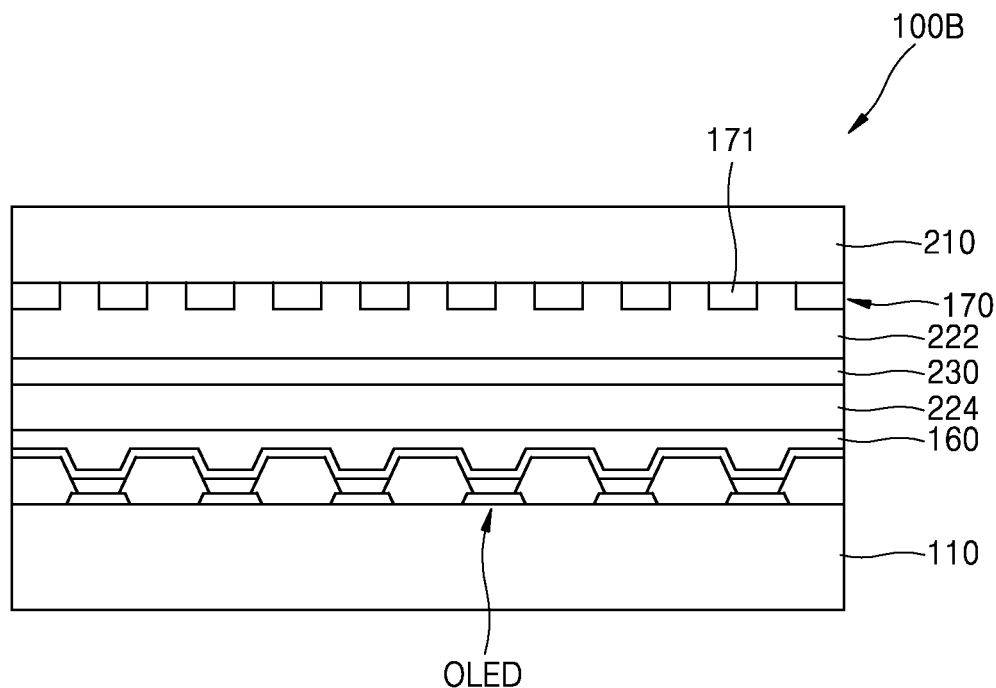
FIG. 8 is a schematic cross-sectional view illustrating an example of a display device according to another embodiment.

FIG. 8 is a schematic cross-sectional diagram illustrating an example of a display device 100B according to another embodiment.

The display device 100B of FIG. 8 may include the display substrate 110, the organic light-emitting device OLED arranged on the display substrate 110, the encapsulation layer 160 arranged on the organic light-emitting device OLED, a second cover layer 224 arranged on the encapsulation layer 160, the filling layer 230 arranged on the second cover layer 224, a first cover layer 222 arranged on the filling layer 230, the diffraction grating layer 170 arranged on the first cover layer 222, and the opposite substrate 210 arranged on the diffraction grating layer 170. That is, compared to the display device 100 of FIG. 1, the display device 100B of FIG. 8 further includes the second cover layer 224 between the encapsulation layer 160 and the filling layer 230.

Since the display substrate 110, the organic light-emitting diode OLED, the encapsulation layer 160, the filling layer 230, and the opposite substrate 210 are shown in and described with reference to FIGS. 1 through 4, a description thereof will not be provided here again.

The first cover layer 222 and the second cover layer 224 separate the organic light-emitting diode OLED from the diffraction grating layer 170 by a certain distance. By adjusting thicknesses of the first cover layer 222 and the second cover layer 224, when a light-emitting area of light generated from the organic light-emitting diode OLED is expanded, occurrence of blurring may be prevented. As an example, the first cover layer 222 may have a same thickness as that of the second cover layer 224, and the filling layer 230 may be arranged between the first cover layer 222 and the second cover layer 224. Accordingly, compared to when the first cover layer 222 and the second cover layer 224 are consecutively arranged at a side of the filling layer 230, a stress exerted on the display substrate 110 or the opposite substrate 210 decreases, thereby preventing or minimizing bending of the display substrate 110 or the opposite substrate 210. As another example, a thickness of the second cover layer 224 may be greater than that of the first cover layer 222. Accordingly, a stress exerted on the opposite substrate 210 having a relatively small thickness compared to that of the display substrate 110 is further reduced, thus effectively preventing bending, etc. of the opposite substrate 210.

The first cover layer 222 and the second cover layer 224 may be formed of an inorganic material or an organic material. For example, when the first cover layer 222 and the second cover layer 224 are formed of an inorganic material, the first cover layer 222 and the second cover layer 224 may include at least one among $SiO_2$, SiNx, $ZnO_2$ $TiO_2$, $ZrO_2$, ITO, and IZO. In addition, when the first cover layer 222 and the second cover layer 224 are formed of an organic material, the first cover layer 222 and the second cover layer 224 may include at least one among acryl, Alq3, CuPc, CBP, and a-NPB. The first cover layer 222 may include a same material as that of the second cover layer 224. Accordingly, when whole thicknesses of the first cover layer 222 and the second cover layer 224 are identical or similar to a thickness of the first cover layer 220 of FIG. 1, a distance of diffraction caused by the second cover layer 224 and the first cover layer 22 may be kept identical or similar to the distance of diffraction in the case described with reference to FIG. 1.

Figure 9:
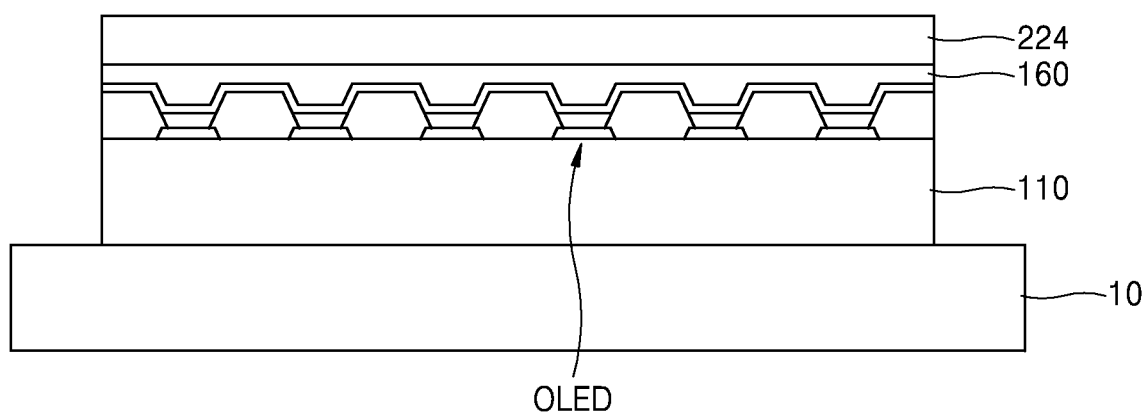
FIGS. 9 and 10 are schematic cross-sectional views illustrating a method of manufacturing the display device of FIG. 8.
Figure 10:
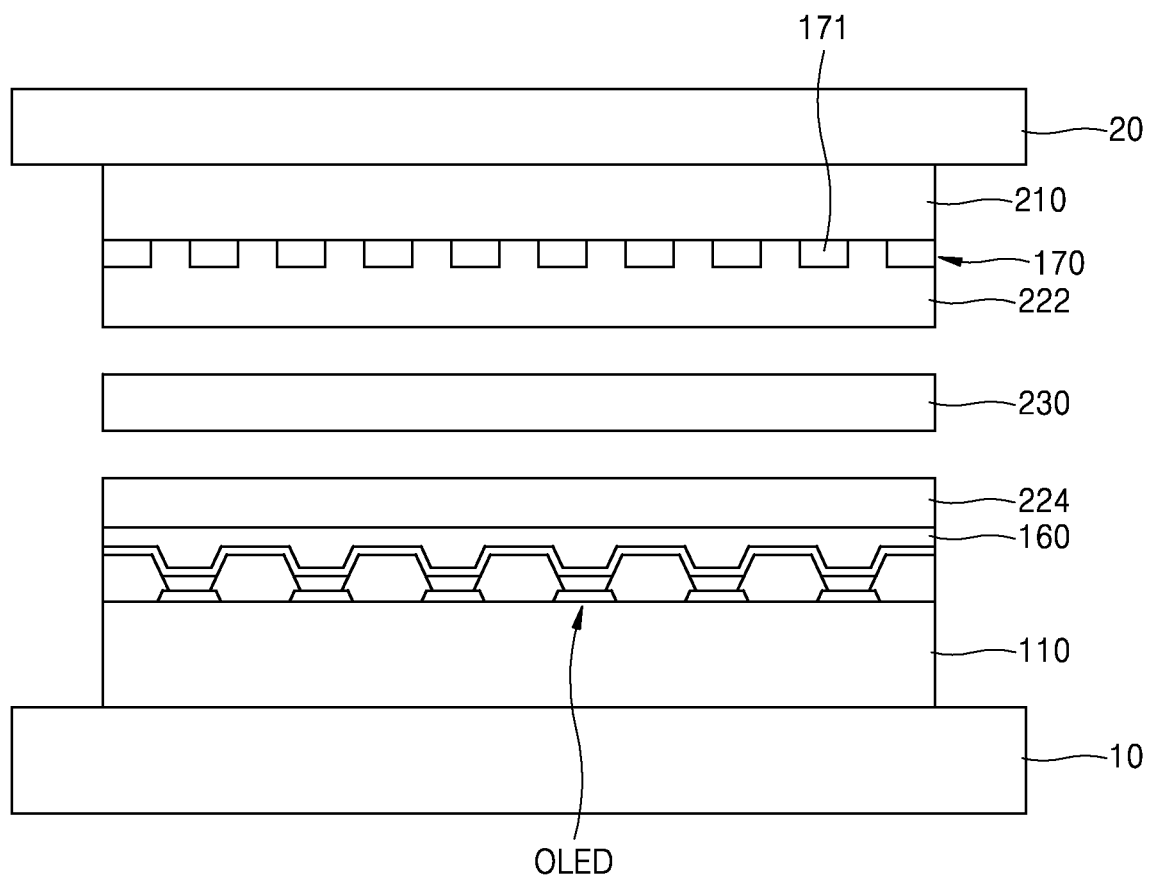

FIGS. 9 and 10 are schematic cross-sectional diagrams illustrating a method of manufacturing the display device 110B of FIG. 8.

According to an embodiment, a method of manufacturing the display device 110B may include forming the organic light-emitting diode OLED and the encapsulation layer 160 on the display substrate 110, forming the second cover layer 224 on the encapsulation layer 160, forming the diffraction grating layer 170 and the first cover layer 222 on a surface of the opposite substrate 210, and attaching the display substrate 110 to the opposite substrate 210 by using the filling layer 230.

As illustrated in FIG. 9, the organic light-emitting diode OLED is formed on the display substrate 110, and then, the encapsulation layer 160 is formed on the organic light-emitting diode OLED to seal the organic light-emitting diode OLED. As described above, the thin-film transistor TFT of FIG. 2 electrically connected to the organic light-emitting diode OLED may be formed on the display substrate 110. In addition, the second cover layer 224 may be further formed on the encapsulation layer 160. The second cover layer 224 may include a same material as that of the first cover layer 220 of FIG. 1.

The display substrate 110 may be formed on the first carrier substrate 10 formed of a glass material, etc. Accordingly, when the base substrate 101 of FIG. 2, of the display substrate 110, is formed of a flexible material, the base substrate 101 of FIG. 2 may be kept flat when the thin-film transistor TFT of FIG. 2, the organic light-emitting diode OLED, the encapsulation layer 160, and the second cover layer 224, etc. are formed on the base substrate 101 of FIG. 2 having a small thickness.

Then, as illustrated in FIG. 10, the diffraction grating layer 170 and the first cover layer 220 are consecutively formed on a surface of the opposite substrate 210.

The opposite substrate 210 may be formed of, as an example, polyimide on the second carrier substrate 20 formed of a glass material, etc. Accordingly, when the diffraction grating layer 170 and the first cover layer 222 are formed on the opposite substrate 210, bending of the opposite substrate 210 may be prevented.

The diffraction grating layer 170 may include at least one among silicon oxide, silicon nitride, and silicon oxynitride. As an example, the diffraction grating layer 170 may be formed by positioning a deposition mask on a surface of the opposite substrate 210, and then, depositing the materials described above. The deposition mask includes a plurality of openings, and the plurality of diffraction patterns 171 of the diffraction grating layer 170 may be formed at positions of the plurality of openings. As another example, a material of the diffraction grating layer 170 may be deposited on a surface of the opposite substrate 210 to form a layer, and then, patterned to thereby form the plurality of diffraction patterns 171.

The first cover layer 222 is formed to cover the plurality of diffraction patterns 171. Accordingly, the first cover layer 220 is arranged not only on the plurality of diffraction patterns 171 but also on a surface of the opposite substrate 210 between the diffraction patterns 171. That is, the plurality of diffraction patterns 171 may have a shape protruded into the first cover layer 220.

The first cover layer 222 may be formed of a same material as that of the second cover layer 224. The first cover layer 222 and the second cover layer 224 separate the organic light-emitting diode OLED from the diffraction grating layer 170 by a certain distance. By adjusting thicknesses of the first cover layer 222 and the second cover layer 224, when a light-emitting area of light generated from the organic light-emitting diode OLED is expanded, occurrence of blurring may be prevented. Accordingly, when the first cover layer 222 may include a same material as that of the second cover layer 224 and whole thicknesses of the first cover layer 222 and the second cover layer 224 are identical or similar to a thickness of the first cover layer 220 of FIG. 1, a distance of diffraction caused by the second cover layer 224 and the first cover layer 222 may be kept identical or similar to the distance of diffraction in the case described with reference to FIG. 1.

As an example, the first cover layer 222 may have a same thickness as that of the second cover layer 224. Accordingly, compared to when the first cover layer 222 and the second cover layer 224 are consecutively formed at a side of the filling layer 230, a stress exerted on the display substrate 110 or the opposite substrate 210 decreases, thereby preventing or minimizing bending of the display substrate 110 or the opposite substrate 210. As another example, a thickness of the first cover layer 222 may be smaller than that of the second cover layer 224. Accordingly, a stress exerted on the opposite substrate 210 having a relatively small thickness compared to that of the display substrate 110 is further reduced, thus effectively preventing bending, etc. of the opposite substrate 210.

Then, after the filling layer 230 is arranged between the display substrate 110 and the opposite substrate 210, the first cover layer 222 is attached to the second cover layer 224. The filling layer 230 may be a PSA, an OCA, etc., and have a thickness of about 10 μm or less.

After the first cover layer 222 is attached to the second cover layer 224, the first carrier substrate 10 is separated from the display substrate 110, and then, the second carrier substrate 20 is separated from the opposite substrate 210. As an example, the first carrier substrate 10 may be separated from the display substrate 110 by radiating laser between the base substrate 101 of FIG. 1 of the display substrate 110 and the first carrier substrate 10. Likewise, the second carrier substrate 20 may be separated from the opposite substrate 210 by radiating laser between the opposite substrate 210 and the second carrier substrate 20.

According to the present disclosure, as a diffraction grating layer increases a light-emitting area by diffracting light generated from a display device, when a head-mounted display device is driven, the display device may resolve an SDE and provide a high-quality image. However, a scope of the present disclosure is not limited by such an effect.

It should be understood that embodiments described herein should be considered in a descriptive sense only and not for purposes of limitation. Descriptions of features or aspects within each embodiment should typically be considered as available for other similar features or aspects in other embodiments.

While one or more embodiments have been described with reference to the figures, it will be understood by those of ordinary skill in the art that various changes in form and details may be made therein without departing from the spirit and scope as defined by the following claims.

What is claimed is:
1. A display device comprising:
a display substrate;
a light-emitting device on the display substrate;
an encapsulation layer arranged over the display substrate and encapsulating the light-emitting device;
a filling layer on the encapsulation layer;
a first cover layer being formed of a material different from the filling layer and disposed on the filling layer;
an opposite substrate on the first cover layer; and
a diffraction grating layer between the first cover layer and the opposite substrate, wherein the diffraction grating layer comprises a plurality of isolated diffraction patterns spaced apart from each other by a certain distance, wherein the plurality of diffraction patterns protrude from a surface of the opposite substrate in a direction perpendicular to the opposite substrate, and the surface of the opposite substrate faces the display substrate, and wherein a thickness of the filling layer is smaller than that of the first cover layer.

2. The display device of claim 1, further comprising a second cover layer between the encapsulation layer and the filling layer.

3. The display device of claim 2, wherein a thickness of the second cover layer is greater than a thickness of the first cover layer.

4. The display device of claim 2, wherein the first cover layer comprises a same material as that of the second cover layer.

5. The display device of claim 1, wherein the plurality of diffraction patterns are arranged with a same period in a first direction and a second direction which intersect each other perpendicularly.

6. The display device of claim 1, wherein the encapsulation layer comprises a first inorganic encapsulation layer, an organic encapsulation layer, and a second inorganic encapsulation layer which are sequentially stacked.

7. The display device of claim 1, wherein light generated from the light-emitting device passes through the diffraction grating layer such that a light-emitting area is expanded.

8. The display device of claim 1, wherein the display substrate comprises a base substrate and a thin-film transistor, the thin-film transistor being arranged over the base substrate and electrically connected to the light-emitting device, and the light-emitting device is an organic light-emitting diode having a pixel electrode electrically connected to the thin-film transistor, an opposite electrode over the pixel electrode, and an intermediate layer between the pixel electrode and the opposite electrode and comprising an emission layer.

9. The display device of claim 8, wherein the base substrate and the opposite substrate each comprise polyimide.

10. The display device of claim 1, wherein the plurality of diffraction patterns diffract light generated from the light-emitting device to generate a reference light emission pattern and a plurality of duplicate light emission patterns.

11. A method of manufacturing a display device, the method comprising:

forming a light-emitting device on a display substrate;

forming an encapsulation layer on the display substrate to encapsulate the light-emitting device;

forming a diffraction grating layer on a surface of an opposite substrate;

forming a first cover layer on the diffraction grating layer; and arranging the opposite substrate such that the diffraction grating layer faces the display substrate, and then, attaching the opposite substrate to the display substrate by using a filling layer, wherein the diffraction grating layer protrudes from the surface of the opposite substrate in a direction perpendicular to the opposite substrate and comprises a plurality of isolated diffraction patterns spaced apart from each other, wherein the first cover layer is formed of a material different from the filling layer and disposed on the plurality of diffraction patterns and on the surface of the opposite substrate between the plurality of diffraction patterns, and wherein a thickness of the filling layer is smaller than that of the first cover layer.

12. The method of claim 11, wherein the plurality of diffraction patterns are arranged with a same period in a first direction and a second direction which intersect each other perpendicularly.

13. The method of claim 11, further comprising, before attaching the opposite substrate to the display substrate, forming a second cover layer on the encapsulation layer.

14. The method of claim 13, wherein a thickness of the second cover layer is greater than a thickness of the first cover layer.

15. The method of claim 13, wherein the first cover layer comprises a same material as that of the second cover layer.

16. The method of claim 11, wherein the display substrate comprises a base substrate and a thin-film transistor, the thin-film transistor being arranged over the base substrate and electrically connected to the light-emitting device, and the base substrate is formed on a first carrier substrate, and after the opposite substrate is attached to the display substrate, the first carrier substrate is separated from the base substrate.

17. The method of claim 16, wherein the light-emitting device is an organic light-emitting diode having a pixel electrode electrically connected to the thin-film transistor, an opposite electrode over the pixel electrode, and an intermediate layer between the pixel electrode and the opposite electrode and comprising an emission layer.

18. The method of claim 16, wherein the opposite substrate is formed on a second carrier substrate, and after the opposite substrate is attached to the display substrate, the second carrier substrate is separated from the opposite substrate.

19. The method of claim 18, wherein the base substrate and the opposite substrate each comprise polyimide.

20. The method of claim 11, wherein the encapsulation layer is formed by sequentially stacking a first inorganic encapsulation layer, an organic encapsulation layer, and a second inorganic encapsulation layer.

* * * * *